United States Patent
Franca-Neto et al.

(10) Patent No.: US 10,929,058 B2
(45) Date of Patent: Feb. 23, 2021

(54) ENHANCED MEMORY DEVICE ARCHITECTURE FOR MACHINE LEARNING

(71) Applicant: Western Digital Technologies, Inc., San Jose, CA (US)

(72) Inventors: Luiz M. Franca-Neto, Sunnyvale, CA (US); Viacheslav Dubeyko, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 8 days.

(21) Appl. No.: 16/363,661

(22) Filed: Mar. 25, 2019

(65) Prior Publication Data

US 2020/0310674 A1 Oct. 1, 2020

(51) Int. Cl.
G06F 3/06 (2006.01)
G06N 3/02 (2006.01)
G11C 14/00 (2006.01)

(52) U.S. Cl.
CPC .......... *G06F 3/0655* (2013.01); *G06F 3/0604* (2013.01); *G06F 3/0679* (2013.01); *G06N 3/02* (2013.01); *G11C 14/0009* (2013.01)

(58) Field of Classification Search
CPC ............................. G06F 3/0655; G06F 3/0604
See application file for complete search history.

(56) References Cited

U.S. PATENT DOCUMENTS

| | | | |
|---|---|---|---|
| 3,602,186 A | 8/1971 | Popenoe | |
| 5,519,811 A | 5/1996 | Yoneda et al. | |
| 5,627,943 A | 5/1997 | Yoneda et al. | |
| 7,085,749 B2 | 8/2006 | Matsugu | |
| 7,437,339 B2 | 10/2008 | Matsugu | |
| 7,489,834 B2 | 2/2009 | Kloth | |
| 7,564,996 B2 | 7/2009 | Kloth | |
| 7,743,004 B2 | 6/2010 | Matsugu | |
| 8,724,624 B2 | 5/2014 | Bazlamacci et al. | |
| 9,721,203 B1 | 8/2017 | Young et al. | |
| 9,747,548 B2 | 8/2017 | Ross et al. | |

(Continued)

FOREIGN PATENT DOCUMENTS

| | | |
|---|---|---|
| AU | 197131902 A | 2/1973 |
| BE | 771045 A | 12/1973 |

(Continued)

OTHER PUBLICATIONS

International Search Report and Written Opinion from International Application No. PCT/US2018/066593, dated Mar. 29, 2019, 11 pages.

(Continued)

*Primary Examiner* — Sean D Rossiter
(74) *Attorney, Agent, or Firm* — Barry IP Law, P.C.

(57) ABSTRACT

Embodiments of an improved memory architecture by processing data inside of the memory device are described. In some embodiments, the memory device can store neural network layers, such as a systolic flow engine, in non-volatile memory and/or a separate DRAM memory. Central processing unit (CPU) of a host system can delegate the execution of a neural network to the memory device. Advantageously, neural network processing in the memory device can be scalable, with the ability to process large amounts of data.

18 Claims, 10 Drawing Sheets

(56) References Cited

U.S. PATENT DOCUMENTS

| | | |
|---|---|---|
| 9,805,303 B2 | 10/2017 | Ross et al. |
| 9,959,500 B1 | 5/2018 | Torng et al. |
| 10,043,095 B2 | 8/2018 | Yang et al. |
| 10,083,171 B1 | 9/2018 | Yang et al. |
| 10,102,453 B1 | 10/2018 | Yang et al. |
| 2003/0004907 A1 | 1/2003 | Matsugu |
| 2004/0156546 A1 | 8/2004 | Kloth |
| 2004/0156547 A1 | 8/2004 | Kloth |
| 2007/0011120 A1 | 1/2007 | Matsugu |
| 2008/0270335 A1 | 10/2008 | Matsugu |
| 2012/0257506 A1 | 10/2012 | Bazlamacci et al. |
| 2014/0270494 A1 | 9/2014 | Sawhney et al. |
| 2016/0142731 A1 | 5/2016 | Nakagami et al. |
| 2016/0342893 A1 | 11/2016 | Ross et al. |
| 2017/0103318 A1 | 4/2017 | Ross et al. |
| 2018/0005115 A1 | 1/2018 | Gokmen et al. |
| 2018/0101743 A1 | 4/2018 | Yang et al. |
| 2018/0101747 A1 | 4/2018 | Yang et al. |
| 2018/0101748 A1 | 4/2018 | Yang et al. |
| 2018/0107921 A1 | 4/2018 | Ross et al. |
| 2018/0129936 A1 | 5/2018 | Young et al. |
| 2018/0157940 A1 | 6/2018 | Yang et al. |
| 2018/0174031 A1 | 6/2018 | Yang et al. |
| 2018/0189595 A1 | 7/2018 | Yang et al. |
| 2018/0247113 A1 | 8/2018 | Yang et al. |
| 2018/0268234 A1 | 9/2018 | Yang et al. |
| 2018/0285005 A1 | 10/2018 | Torng et al. |
| 2018/0285006 A1 | 10/2018 | Torng et al. |
| 2018/0285713 A1 | 10/2018 | Torng et al. |
| 2018/0285714 A1 | 10/2018 | Torng et al. |
| 2018/0285720 A1 | 10/2018 | Torng et al. |
| 2018/0285722 A1 | 10/2018 | Torng et al. |
| 2018/0285723 A1 | 10/2018 | Torng et al. |
| 2018/0309050 A1 | 10/2018 | Torng et al. |
| 2020/0073726 A1* | 3/2020 | Lee .................. G06N 3/04 |
| 2020/0133531 A1* | 4/2020 | Subramaniam ....... G06F 3/0631 |
| 2020/0134462 A1* | 4/2020 | Gupta .................. G06N 5/022 |

FOREIGN PATENT DOCUMENTS

| | | |
|---|---|---|
| CA | 930619 A1 | 7/1973 |
| DE | 2139302 C3 | 10/1978 |
| ES | 196704 Y | 8/1975 |
| FR | 2104032 A5 | 4/1972 |
| GB | 1316899 A | 5/1973 |
| IL | 37434 A | 1/1974 |
| KR | 197900473 B1 | 5/1979 |
| SE | 361090 B | 10/1973 |
| WO | 2017006512 A1 | 1/2017 |

OTHER PUBLICATIONS

International Search Report and Written Opinion from International Application No. PCT/US2018/066917, dated Mar. 29, 2019, 11 pages.

Mahapatra et al.; "Mapping of Neural Network Models onto Systolic Arrays", Journal of Parallel and Distributed Computing, vol. 60, Issue 6, Jun. 2000, pp. 677-689; available at: https://www.sciencedirect.com/science/article/abs/pii/S0743731500916344.

Pending U.S. Appl. No. 15/981,679, filed May 16, 2018, entitled "Systolic Neural Network Engine With Crossover Connection Optimization", Luiz M. Franca-Neto.

Pending U.S. Appl. No. 16/363,744, filed Mar. 25, 2019, entitled "Enhanced Storage Device Memory Architecture for Machine Learning", Luiz M. Franca-Neto.

U.S. Appl. No. 16/234,184, filed Dec. 27, 2018, Franca-Neto.
U.S. Appl. No. 16/233,876, filed Dec. 27, 2018, Franca-Neto.
U.S. Appl. No. 15/981,624, filed May 16, 2018, Franca-Neto.
U.S. Appl. No. 16/233,968, filed Dec. 27, 2018, Franca-Neto.
U.S. Appl. No. 16/234,166, filed Dec. 27, 2018, Franca-Neto.
U.S. Appl. No. 15/981,664, filed May 16, 2018, Franca-Neto.
U.S. Appl. No. 15/981,719, filed May 16, 2018, Franca-Neto.
U.S. Appl. No. 15/981,711, filed May 16, 2018, Franca-Neto.
U.S. Appl. No. 15/981,735, filed May 16, 2018, Franca-Neto.

* cited by examiner

US 10,929,058 B2

ENHANCED MEMORY DEVICE ARCHITECTURE FOR MACHINE LEARNING

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

TECHNICAL FIELD

The present disclosure relates to memory device architecture, and more particularly, to data processing inside the memory device via improving machine learning.

BACKGROUND

Machine learning techniques, such as neural networks, are frequently being utilized by modern computing systems. These technologies can operate on large data sets and thus can require large amounts of storage space. However, current memory architectures do not allow for scalability of big data analysis. The present disclosure addresses these and other problems.

BRIEF DESCRIPTION OF THE DRAWINGS

The innovations described in the claims each have several aspects, no single one of which is solely responsible for its desirable attributes. Without limiting the scope of the claims, some prominent features of this disclosure will now be briefly described.

DETAILED DESCRIPTION

Figure 1A:
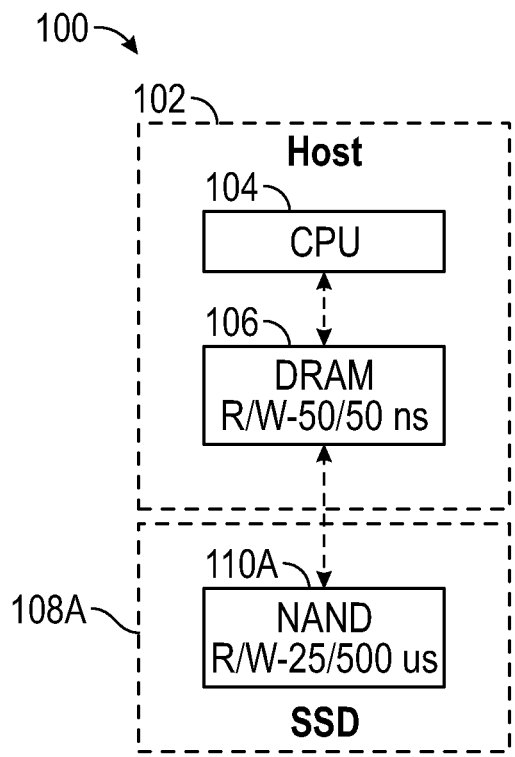
FIGS. 1A and 1B are examples of persistent data transferred between DRAM and persistent storage according to the prior art.

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Various embodiments of this disclosure provide a memory device (or storage device) configured to perform neural network computations, the device comprising: a volatile memory; a non-volatile memory configured to store one or more layers of a neural network; and a controller configured to: store data in at least one of the volatile memory or the non-volatile memory and retrieve data from at least one of the volatile memory or the non-volatile memory in response to at least one data transfer command received from a host system; perform neural network computations in the non-volatile memory by applying one or more neural network layers to input data received from the host system; and store a result of the neural network computations in the volatile memory for retrieval by the host system.

In the memory device of the preceding paragraph or any paragraphs herein, the input data can be stored in the volatile memory.

In the memory device of the preceding paragraph or any paragraphs herein, the controller can be further configured to perform neural network computations for a plurality of neural networks and use a result of neural network computations for a first neural network as input data for a successive neural network.

In the memory device of the preceding paragraph or any paragraphs herein, the controller can be further configured to reconfigure the first neural network as the successive neural network before inputting the data into the successive network.

In the memory device of the preceding paragraph or any paragraphs herein, the controller can be a sole controller of the memory device.

In the memory device of the preceding paragraph or any paragraphs herein, the controller can be further configured to provide the result of the neural network computations to the host system asynchronously.

In the memory device of the preceding paragraph or any paragraphs herein, provision of the result asynchronously can comprise at least one of polling a state of memory pages in the non-volatile memory or issuing an interrupt.

In the memory device of the preceding paragraph or any paragraphs herein, polling can comprise periodic polling of the state of memory pages.

In the memory device of the preceding paragraph or any paragraphs herein, the result of the neural network computations can be configured to be retrieved synchronously.

In the memory device of the preceding paragraph or any paragraphs herein, the memory device can be further configured to receive a request to initiate neural network computations, the request comprising neural network configuration parameters and input data for neural network computations.

In the memory device of the preceding paragraph or any paragraphs herein, the request to initiate neural network computations can comprise a type of data processing, and the controller can be further configured to identify neural network configuration parameters based on the type of data processing.

Various embodiments of this disclosure provide a method of performing neural network computations in a memory device, the method comprising: by a controller of the memory device: storing data in at least one of the volatile memory or the non-volatile memory and retrieve data from at least one of the volatile memory or the non-volatile memory in response to at least one data transfer command received from a host system; performing neural network computations in the non-volatile memory by applying one or more neural network layers to input data received from the host system; and storing a result of the neural network computations in the volatile memory for retrieval by the host system.

The method of the preceding paragraph or any paragraphs herein, can include setting a locked state of the data before inputting the data into the neural network, and setting an unlocked state of the data after making the output of the neural network available, wherein the locked state can prevent changing the data.

The method of the preceding paragraph or any paragraphs herein, can include configuring the neural network configured to perform the data processing function on the data based on at least one of a number of nodes or a type of activation function.

The method of the preceding paragraph or any paragraphs herein, can include inputting the data into the neural network by initiating back propagation on the neural network, and output of the neural network can include an adjusted weighting for one or more nodes of the neural network.

Various embodiments of this disclosure provide a data storage device configured to perform neural network computations, the data storage device comprising a volatile memory, non-volatile memory, and a sole controller configured to: store data in at least one of the volatile memory or the non-volatile memory and retrieve data from at least one of the volatile memory or the non-volatile memory in response to at least one data transfer command received from a host system; perform neural network computations in the non-volatile memory by applying one or more neural network layers to input data received from the host system and stored in the volatile memory; and store a result of the neural network computations in the volatile memory for retrieval by the host system.

In the device of the preceding paragraph or any paragraphs herein, the request to initiate neural network computations can comprise a type of data processing, and the controller can be further configured to identify neural network configuration parameters based on the type of data processing.

In the device of the preceding paragraph or any paragraphs herein, the neural network may not be directly accessible by a processor of the host system.

In the device of the preceding paragraph or any paragraphs herein, the request to perform the data processing function can comprise neural network configuration parameters and input data for the neural network computations, and the controller can be further configured to define the one or more neural network layers based on the neural network configuration parameters.

In the device of the preceding paragraph or any paragraphs herein, the request to perform the data processing function can comprise a type of data processing, and the controller can be further configured to identify neural network configuration parameters based on the type of data processing and define the one or more neural network layers based on the neural network configuration parameters.

Overview

Traditional memory architectures, such as the architecture found in non-volatile memory (NVM), magnetic random-access memory (MRAM), resistive random-access memory (ReRAM), nantero random-access memory (NRAM), and/or the like, can have low latency properties, providing opportunities to increase performance of computer systems dramatically. However, these traditional memory architectures are unable to efficiently take advantage of the non-volatile memory. Traditional memory architectures suffer from critical drawbacks, in particular if some data is not pre-fetched into the page cache, then persistent data is transferred to the dynamic random-access memory (DRAM) from persistent storage when some data is processed.

Figure 1B:
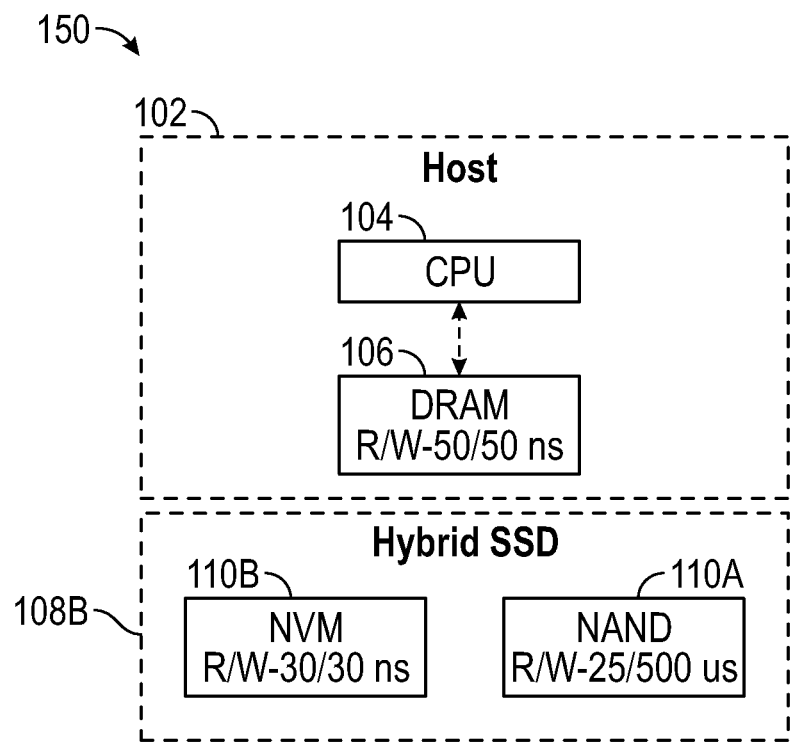

FIGS. 1A and 1B are examples 100 and 150 of persistent data transferred between DRAM and persistent storage. The host 102 can include a CPU 104 and DRAM 106. The interface circuitry for the DRAM 106 communicates with the interface circuitry for the persistent storage, such as the solid state drive (SSD) 108A or a hybrid SSD 108B, for each data that has to be processed. The SSD 108A can include a NAND flash memory 110A. The hybrid SSD 108B can include a NAND flash memory 110A and a non-volatile memory (NVM) 110B.

Figure 2:
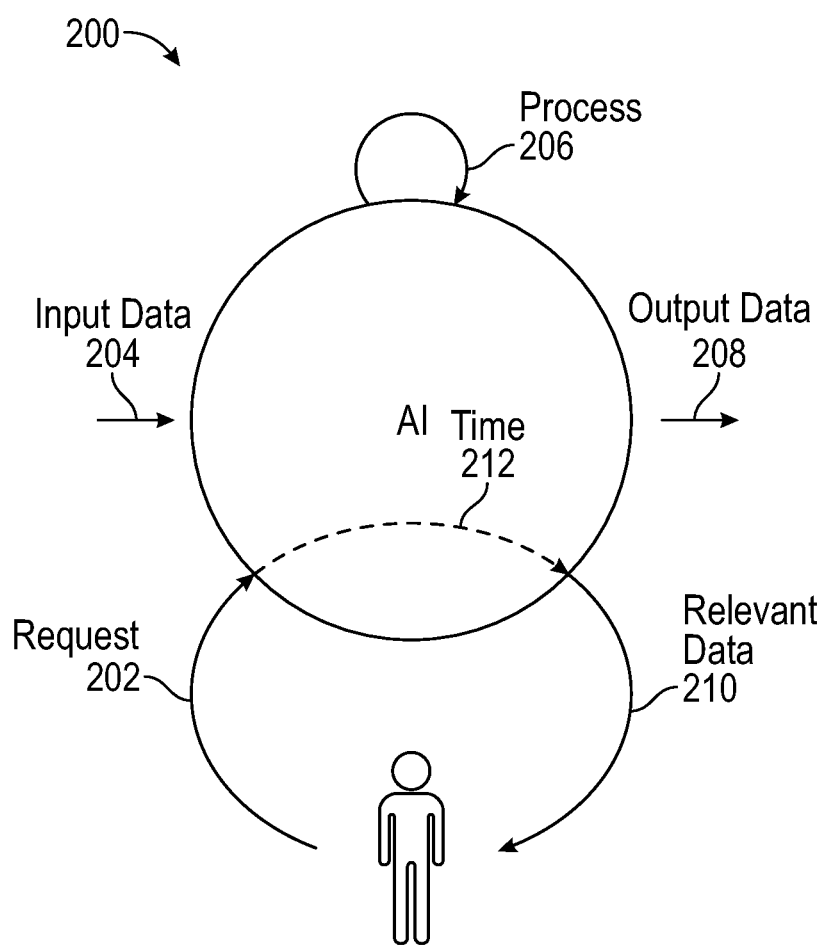
FIG. 2 is an example of analyzing data through artificial intelligence models according to the prior art.

FIG. 2 is an example 200 of analyzing data through artificial intelligence models. In step 202, a host can request analysis of data. The data can be inputted into an artificial intelligence model 204, the data 206 can be processed via the artificial intelligence model, and the data 208 outputted. Then, the user 210 can receive the outputted data. The memory device is typically waiting on receiving the output data and can be wasting time 212 and resources that could have otherwise been used to perform other operations.

Furthermore, current memory chip architectures do not allow for scalability of big data analysis. With such architectures, large amounts of data would have to be transferred to and from the DRAM and the persistent storage devices. As such, simply increasing the number of cores for increased data processing does not address the issues described herein. For example, the storage device may have to copy data to a host side, and the host side may have to process the data. Then, one set of data needs to be copied in DRAM, the CPUs would process the set of data, and the next set of data would then be copied again for processing. This creates a large bottleneck for performance and cannot scale for large data processing. As such, the data processing would take a large amount of time and resource. Moreover, this would result in large overhead in the software stack. Furthermore, with separate CPU cores, each CPU can be dedicated to a subset of data such as modifying the subset of data, resulting in an inconsistent state of data across the CPUs. Moreover, increasing size of the DRAM also comes with inefficiencies, such as an increase in power consumption. Furthermore, the CPU may not be able to address a DRAM over a certain size, and thus the DRAM is not scalable.

Figure 3:
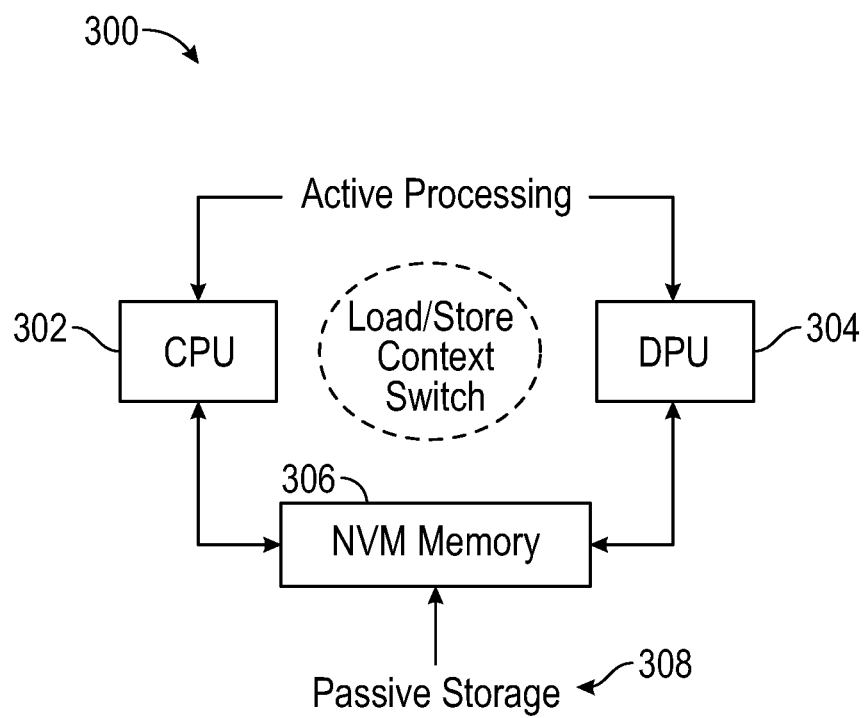
FIG. 3 is an example of a non-volatile memory for central processing unit (CPU) and data processing unit (DPU) operations according to some embodiments.

FIG. 3 is an example 300 of a non-volatile memory for CPU and DPU operations. A storage device can include a central processing unit (CPU) core 302, a data processing unit (DPU) core 304, a non-volatile memory 306, and passive storage 308. The systolic flow engine is described in more detail in patent application titled "Systolic Neural Network Engine Capable of Forward Propagation" (U.S. patent application Ser. No. 15/981,624, filed on May 16, 2018), and in patent application titled "Reconfigurable Systolic Neural Network Engine" (U.S. patent application Ser. No. 16/233,968, filed on Dec. 27, 2018), the disclosures of each of which is hereby incorporated by reference in its entirety.

Advantageously, non-volatile memory can enable scalability for large data processing and reduce power requirements over DRAM. However, introducing non-volatile memory can create new issues. Moreover, the number of CPU cores cannot simply increase because of inefficiencies created in the task scheduler. The activity of the task scheduler by assignment of time slices for threads execution is increased. Moreover, the number of context switches are increased as well. However, if we can offload data processing into memory pages of the smart memory device, then the task scheduler does not need to manage the shared CPU cores. Moreover, there are issues with cache coherence where the data from DRAM is copied into a CPU's L1/L2 cache for data processing, the same portion of data into L1/L2 cache for every CPU core. But if one core modifies the data, then the DRAM contains an inconsistent state of data. As described herein, disclosed embodiments solve at least these problems.

Communication Between Processor and Smart Memory

Figure 4:
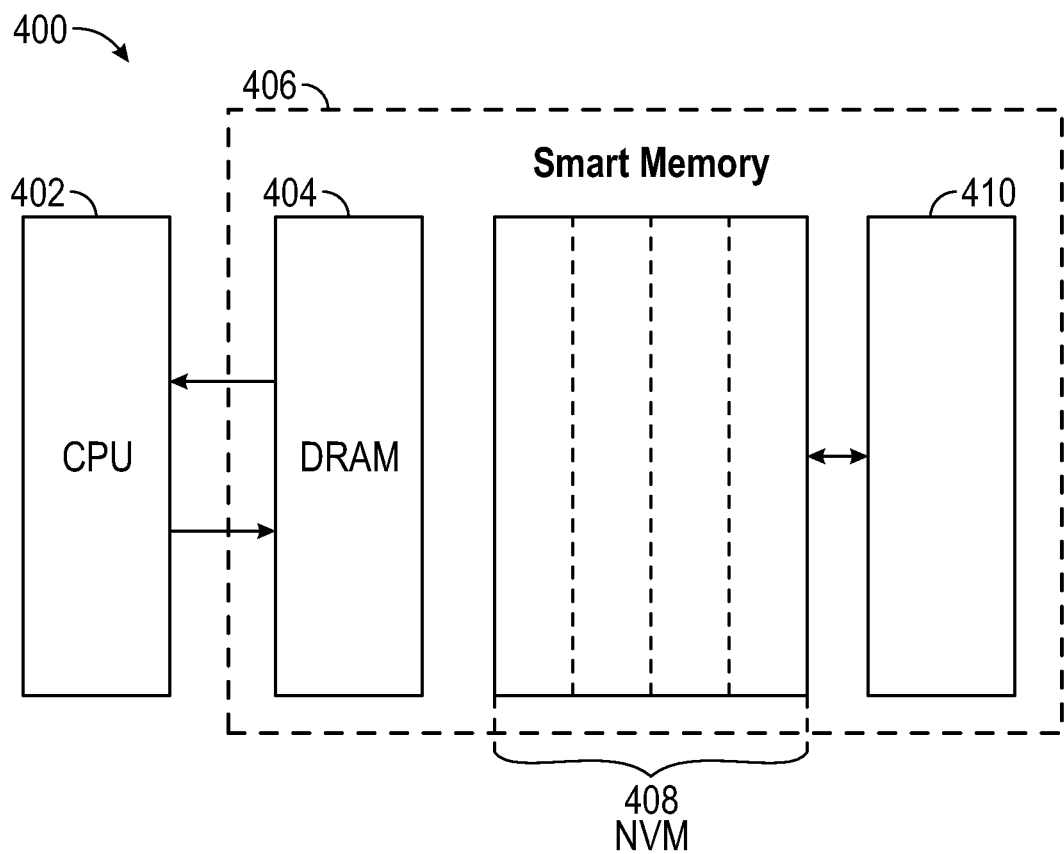
FIG. 4 is an example system illustrating communication between a CPU and smart memory according to some embodiments.

Generally, some embodiments of systems and methods described herein improve memory architecture by processing data inside of the memory device. FIG. 4 is an example system 400 illustrating communication between a processor or controller, such as a CPU, and an improved or enhanced (sometimes referred to as "smart") memory or memory device according to some embodiments. The smart memory device 406 can include a neural network, such as a systolic flow engine, implemented by the non-volatile memory 408, which as described herein can include one or more processors or controllers 410, and a volatile memory, such as DRAM 404, or a non-volatile storage class memory such as MRAM or ReRAM. For the sake of brevity, the rest of the examples in this disclosure will primarily use DRAM for illustration. Note that the various disclosed embodiments are not so limited to the DRAM implementation and can include or apply to any volatile or non-volatile memory used in the same manner by the CPU or other processing unit in the architecture. The DRAM 404 can communicate with an external CPU 402, such as CPU of a host system. Such communication can be performed via a suitable interface (not shown). The smart memory device 406, as the combination of DRAM 404 and non-volatile memory 408 based neural network in a single chip and/or device, can synthesize the CPU-based approach and neural network approach to reduce and/or eliminate the drawbacks mentioned herein. Such combination is able to provide the opportunity to access the data in the DRAM space by a CPU, and also enables the CPU to delegate the execution of specialized processing to the neural network implemented in the non-volatile memory in a faster and more efficient way than by a general purpose CPU. The CPU can initiate data processing in the neural network, and thereafter continue other CPU functions. The CPU can offload the data processing to one or more neural network engines in the memory, thereby relieving the CPU of its resources to perform other tasks. Moreover, the CPU can be the gateway for data processing, ensuring data consistencies. Advantageously, the smart memory device concept may be able to boost the overall system performance.

The improved memory architecture of the smart memory device can transfer data from the storage device into a smart memory device, and thus, the smart memory device can process data internally. Advantageously, data processing on the smart memory device can be scalable, with the ability to process large amounts of data. The smart memory device 406 can store one or more layers of a neural network, as described herein.

Data Processing Via Neural Network in Non-Volatile Memory

Figure 5:
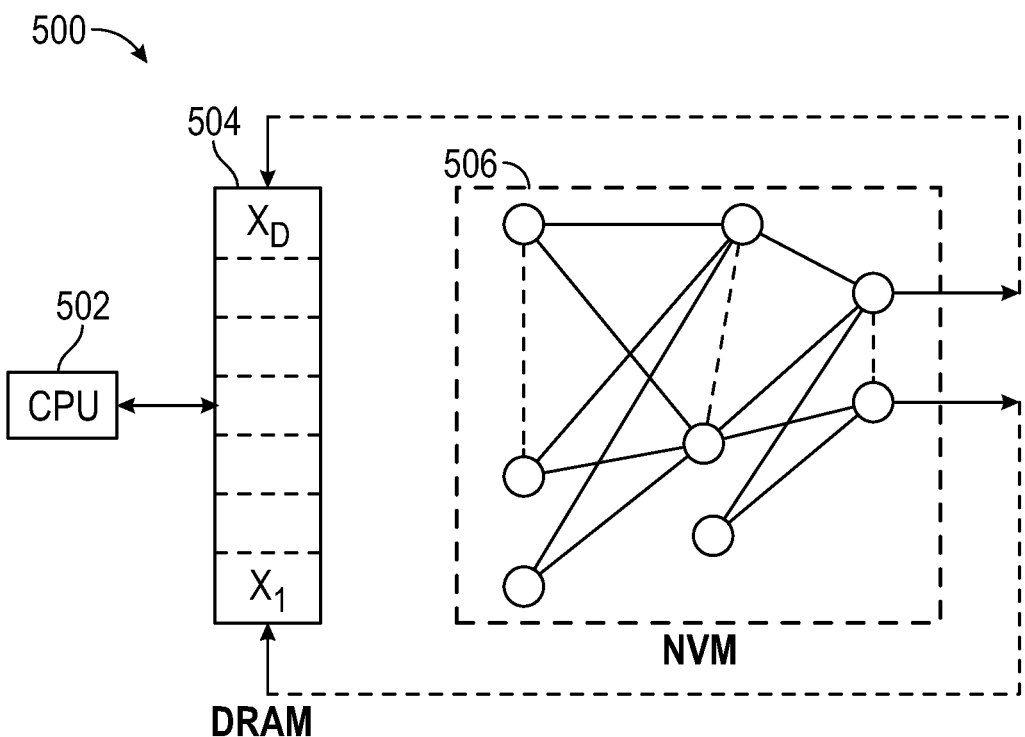
FIG. 5 is an example system for processing data in a neural network stored in non-volatile memory according to some embodiments.

FIG. 5 is an example system 500 for processing data in a neural network implemented in non-volatile memory according to some embodiments. The stored layer in DRAM 504 (partitioned into memory units Xi to XD) can receive input data from the CPU 502. The DRAM can input such data into a neural network implemented in the non-volatile memory 506. The neural network can process the input data through its layers and output data that is stored back in the DRAM 504. The steps and/or functions described below can be performed by the CPU 502 and/or a controller within the smart memory.

In some embodiments, the non-volatile memory can configure and/or reconfigure one or more neural networks, and/or store preconfigured neural networks. The non-volatile memory can configure a neural network based on certain received parameters, such as a number of nodes, layers, weights, a desired inference operation, and/or the like.

In some embodiments, the CPU 502 (and/or a controller) can communicate with the DRAM 504 without knowledge of the underlying data processing via the neural network in the non-volatile memory. For example, the CPU 502 can use the DRAM 504 to perform a particular operation on a set of data. The CPU 502 can determine whether to perform the operation internally or to send the data to the non-volatile memory to process the data. The particular operation can be an inference (or training) operation of a neural network that may require substantial processing. The non-volatile memory 506 can receive the input data from the DRAM 504, configure the neural network to perform the inference (or training) operation, process the data through the neural network, and send (or store) the output data to the DRAM 504. The CPU 502 can subsequently retrieve the results of the inference operation from the DRAM 504. Advantageously, the CPU 502 can offload the execution of the inference operation to a separate non-volatile memory 506. Moreover, the non-volatile memory 506 can execute inference operations of the neural network in parallel or substantially in parallel with the other operations being performed in the DRAM 504.

Data Processing in Layers of a Neural Network

Figure 6:
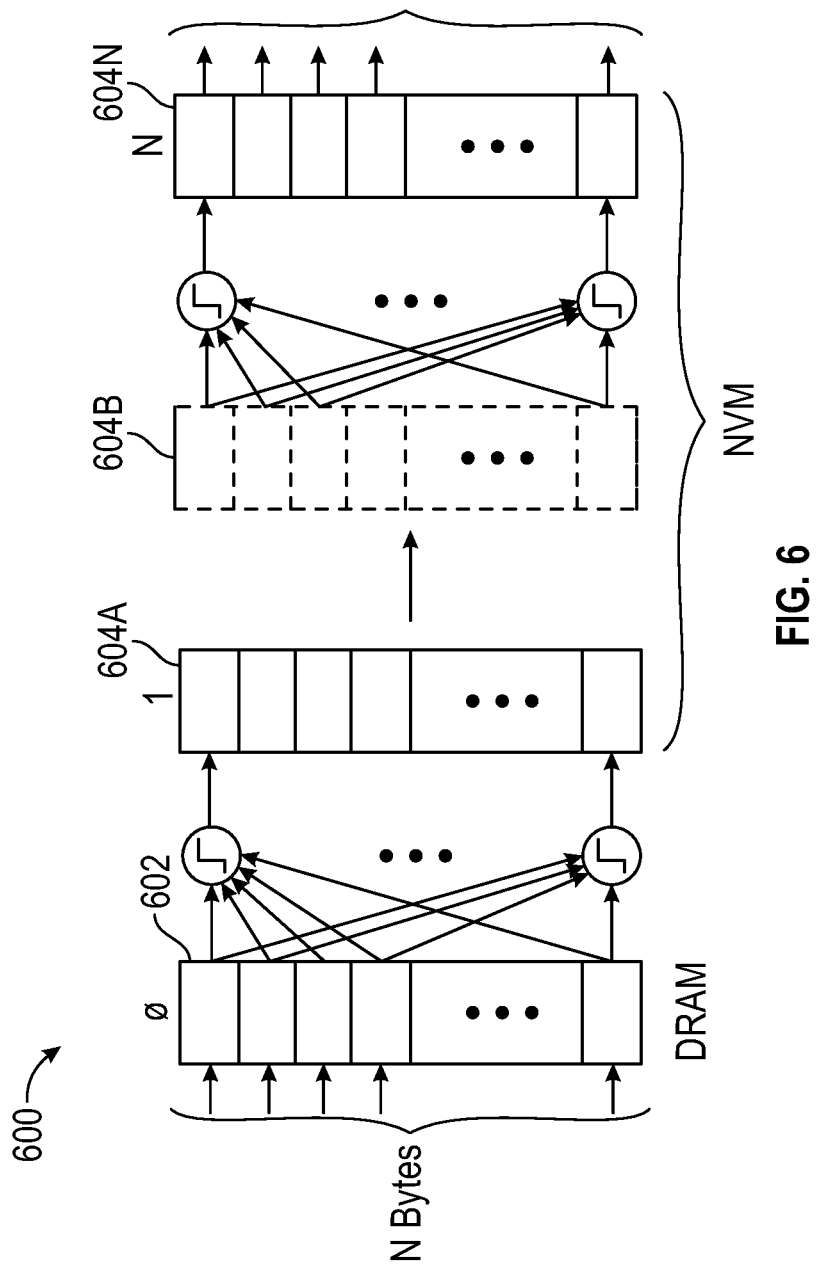
FIG. 6 is an example of data processing in layers of a neural network stored in non-volatile memory according to some embodiments.

FIG. 6 is an example 600 of data processing in layers of a neural network stored in non-volatile memory according to some embodiments. The neural network can efficiently implement specialized data processing. Artificial neural networks (or connectionist systems or machine learning models) can learn to perform certain tasks based on training data. Moreover, such training can occur without task-specific programming. For example, a neural network can learn to identify images that contain cats by analyzing training data of example images that have been manually labeled as "cat" or "no cat." The neural network can adjust it's weightings in the nodes to identify cats in other images.

The neural network engine used by the disclosed embodiments can be configured to any type of neural network. The neural network engine can define a neural network based on one or more factors, including (1) the number of nodes in one layer, (2) the number of hidden layers, (3) the type of activation function, and/or (4) the matrix of weights for every connection between nodes of layers. In some embodiments, the neural network can be defined based on a functionality, and the neural network engine can retrieve a predefined neural network corresponding to the desired functionality.

In some embodiments, a controller, such as the external CPU and/or a controller of the non-volatile memory, can configure the neural network, such as define the type of neural network for processing of the data. The controller can identify the appropriate input data. For example, the input data may include a picture that is sent into a neural network, such as a systolic flow engine, that is trained to identify people in the picture. The systolic flow engine may output an output stream that provides an indication on whether a person was identified in the picture of the input stream.

The DRAM 602 can receive and store the input data (e.g. N Bytes of input data) and push the data into the neural network. The non-volatile memory can include the layers of the neural network 604A, 604B, ... 604N. The output of the neural network can be stored back into the DRAM 602. In some embodiments, an output of one neural network can be fed into an input of another neural network. In some embodiments, the DRAM can feed multiple neural networks in non-volatile memory for data processing of multiple functionalities.

In some embodiments, the CPU can lock the corresponding input data as the input data is pushed into the neural network. Thus, if the neural network is still processing the input data, the CPU can wait for the neural network to complete its computations before modifying the input data. The CPU can access the data without modification, such as by performing a read operation.

In some embodiments, the CPU or DRAM's controller can copy the corresponding input data, and push the copy of the data into the neural network. In such cases, the CPU can modify the original input data while the copy of the data is being processed. The circuitry between the neural network layers can include one or more memory cells to store the outputs of a previous layer as inputs to the next layer.

In some embodiments, the DRAM 602 can serve as the input layer and/or the output layer for the neural network. In other embodiments, the DRAM 602 can input the data into an input layer of a neural network and/or receive the output of an output layer of a neural network.

In some embodiments, the non-volatile memory can include all of the layers of the neural network. In other embodiments, the non-volatile memory (e.g. 408 in FIG. 4) and the DRAM 602 can each implement a subset of the layers of the neural network.

In some embodiments, a controller can control the receiving and/or sending of data to and/or from the DRAM 602. The controller can configure the non-volatile memory for a particular neural network. The controller can facilitate data processing through the neural network stored in the non-volatile memory.

In some embodiments, data can be back-propagated through the layers of the non-volatile memory for training purposes. For example, training data can be forward propagated through the neural network. Based on the output of the neural network, the controller can back propagate through each layer by increasing the weight for the nodes that contributed to the desired output and vice versa.

Repurposing Non-Volatile Memory for Multiple Neural Networks

Figure 7A:
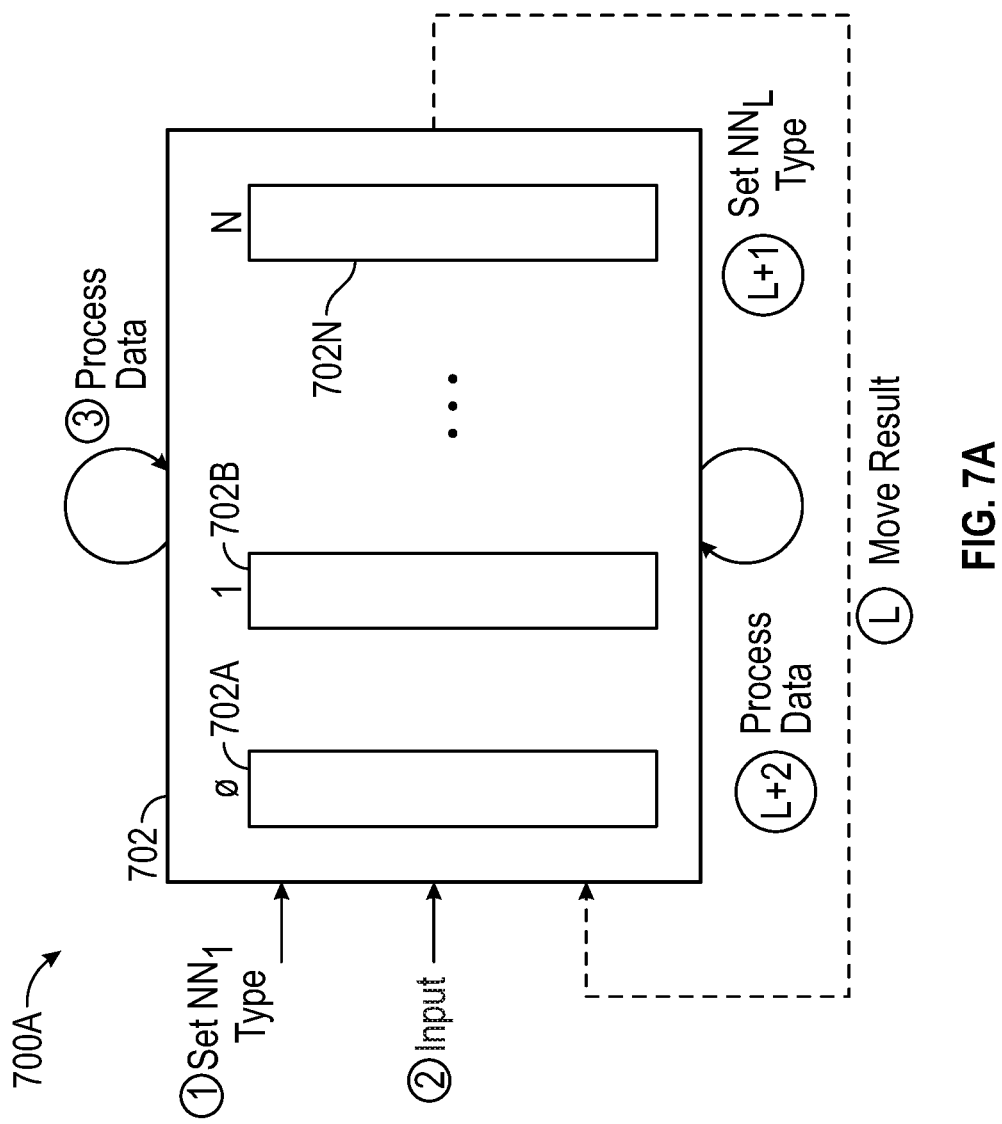
FIG. 7A is an example of repurposing the non-volatile memory for multiple neural networks according to some embodiments.

FIG. 7A is an example 700A of repurposing the non-volatile memory for multiple neural networks according to some embodiments. In step 1, the controller, or an external CPU, can set a neural network type for the non-volatile memory 702. Then at step 2, the controller can cause input data from the DRAM to be inputted into the non-volatile memory 702. This can be accomplished by issuing one or more commands to the smart memory device.

At step 3, the data can be processed through the layers of the neural network 702A, 702B, ... 702N. The output of the non-volatile memory can be inputted back into the non-volatile memory for processing by a subsequent layer. In some cases, multiple neural networks can be used to process data in sequence. For example, at step L, result of processing by a particular neural network can be stored in memory such as temporary memory or buffer (which can be part of the DRAM). At step L+1, subsequent neural network can be configured for the non-volatile memory, and at step L+2, the output that was inputted back into the non-volatile memory can be processed through such subsequent neural network.

Figure 7B:
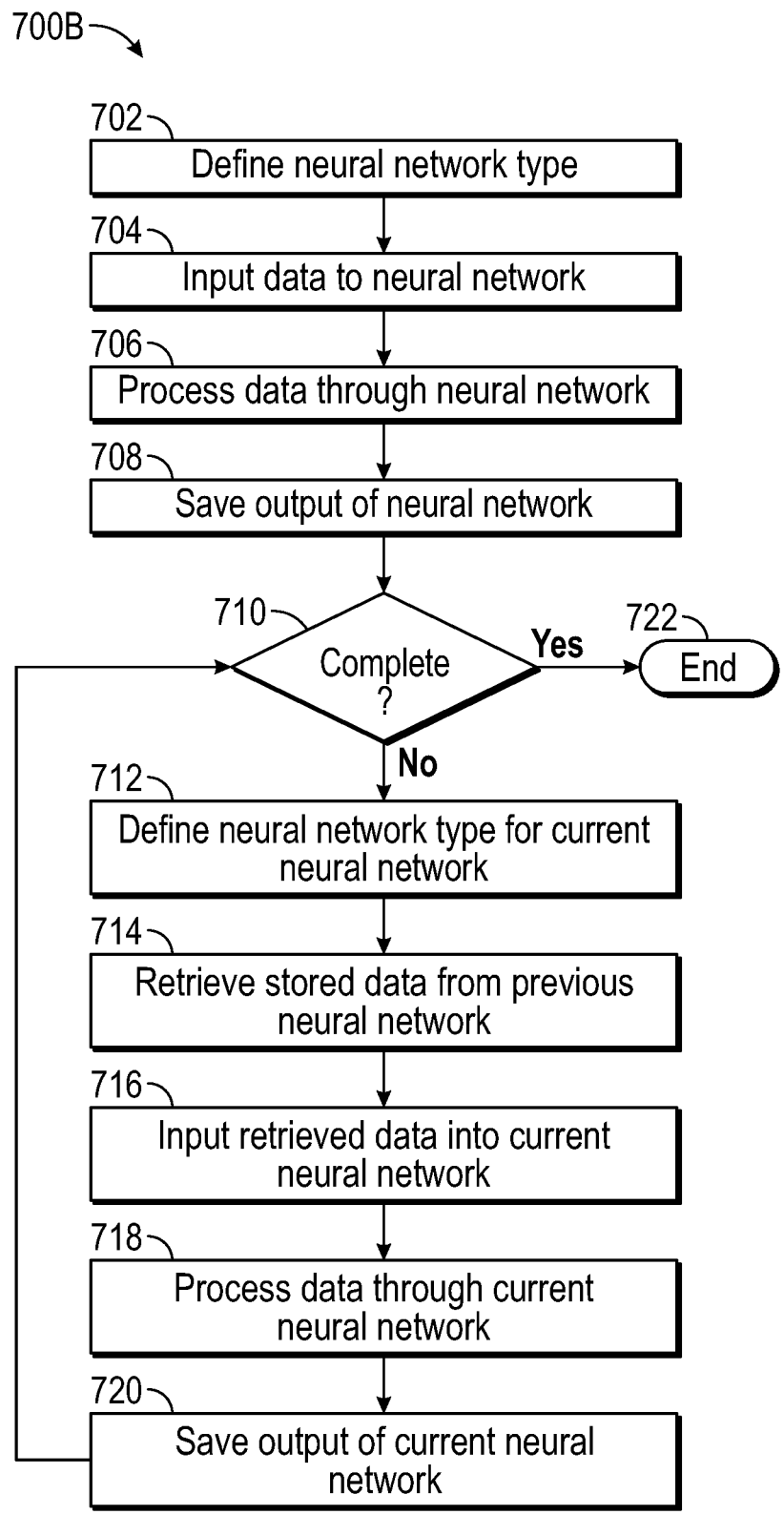
FIG. 7B is an example of a process for repurposing the non-volatile memory for multiple neural networks according to some embodiments.

FIG. 7B is an example of a process 700B for repurposing the non-volatile memory for multiple neural networks according to some embodiments. The process 700B can be implemented by a system including controller and smart memory device as described herein, such as any of the systems 400, 500, or 900A. In step 702, the process can define the type of neural network. For example, the process can identify the appropriate neural network for the desired data processing required by a host.

In step 704, the process can store input data in the DRAM and cause the input data to be provided to the neural network stored in the non-volatile memory. In step 706, the data can be processed by the neural network. In step 708, the process can receive the output of the neural network.

In step 710, the process can determine whether another neural network is to further process the data or if the data processing is complete. If data processing is complete, then the process ends at step 722.

If there are further neural network processing operations, at step 712, the process can define the type of neural network. The process can determine that the same neural network can be rerun and/or a different neural network is needed.

In step 714, the process can retrieve the stored data from the previous neural network, and in step 716, can input the saved output data from the previous neural network into the newly configured neural network. In step 718, the data can be processed through the neural network. In step 720, the process can save the output of the neural network, for example in the DRAM. Then, the process can continue to step 710, where the process can determine whether another neural network is to further process the data or if the data processing is complete.

Multiple Neural Networks Configured in Non-Volatile Memory

Figure 8:
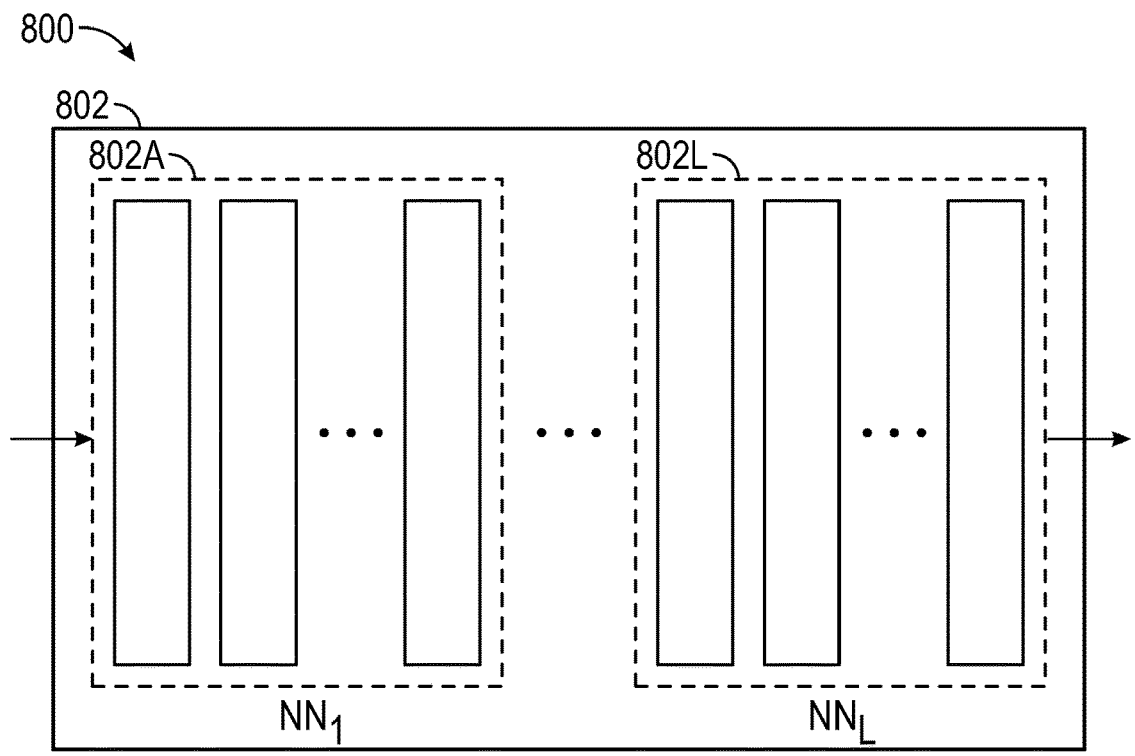
FIG. 8 is an example of multiple neural networks configured in non-volatile memory according to some embodiments.

FIG. 8 is an example 800 of multiple neural networks implemented in non-volatile memory 802 according to some embodiments. As described herein, a controller can configure multiple neural networks in the non-volatile memory 802. For example, a first neural network 802A and a second neural network 802L can be configured in the non-volatile memory. The output of a first neural network 802A can be inputted into the next neural network 802L. Advantageously, the output of the first neural network 802A may not have to be stored in temporary memory before being inputted into the next neural network 802L. In some embodiments, a temporary non-volatile or volatile memory buffer can be used between neural network layers to temporarily save the result of every layer. Advantageously, a neural network activity can continue even after a sudden power-off.

In some embodiments, a smart memory device can process neural networks in series, such as the example shown in FIG. 8, in parallel, and/or a combination thereof.

Smart Memory Device Architecture

Figure 9A:
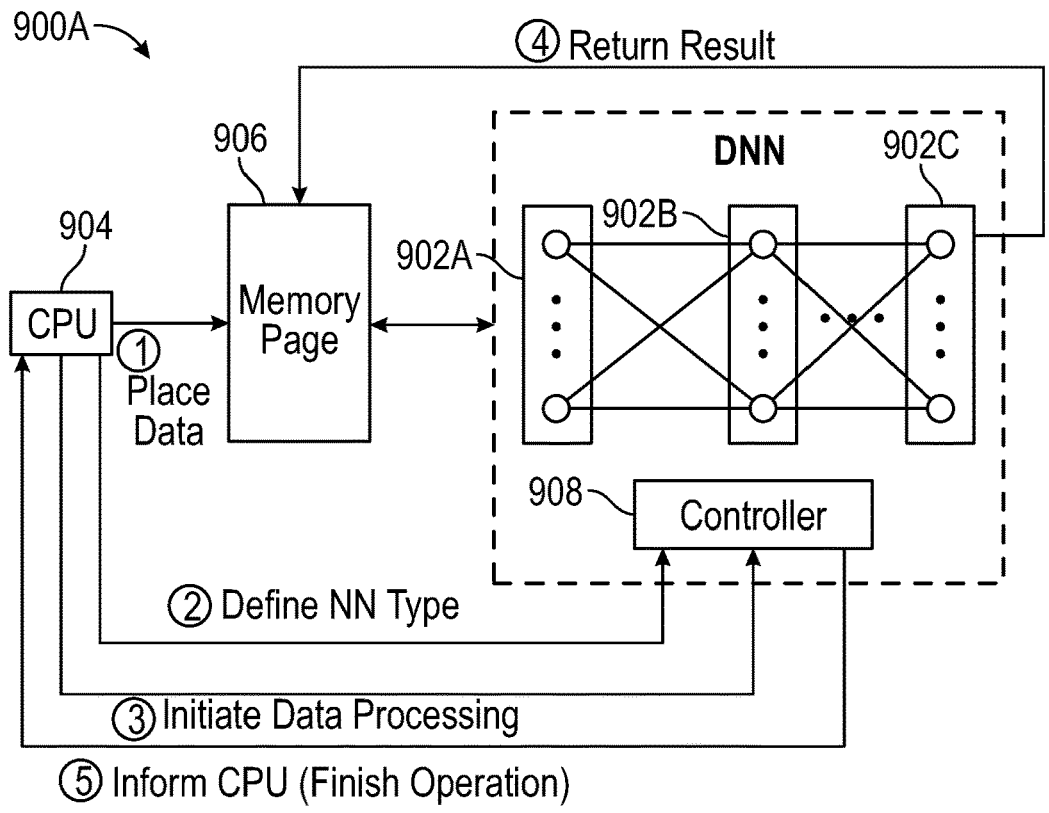
FIG. 9A illustrates an example of the CPU and controller architecture according to some embodiments.

FIG. 9A illustrates an example 900A of the CPU, communicating with a smart memory device according to some embodiments. The steps and/or functions described below can be performed by the CPU 502 and/or a controller within the smart memory. In this example, the CPU 904 transmits data to a memory page (or another memory unit) 906 of the DRAM in step 1. The CPU 904 determines whether the requested processing on the data involves neural network processing. If not, then the CPU 904 can access and/or modify the data (for example, read and/or write data).

If neural network processing is requested, the CPU 904 can send configuration parameters of the desired neural network to a non-volatile memory controller 908. The controller 908 can process the data through the layers 902A, 902B, . . . 902C of the neural network implemented in the non-volatile memory and send the output of the neural network to the memory page 906 of the DRAM (or another area of DRAM) at step 4. In step 5, the controller 908 can indicate to the CPU 904 that the neural network operation is complete. This can be performed by setting or activating an interrupt. In other embodiments, the CPU 904 can poll the controller 908 for a status of the neural network operation.

Figure 9B:
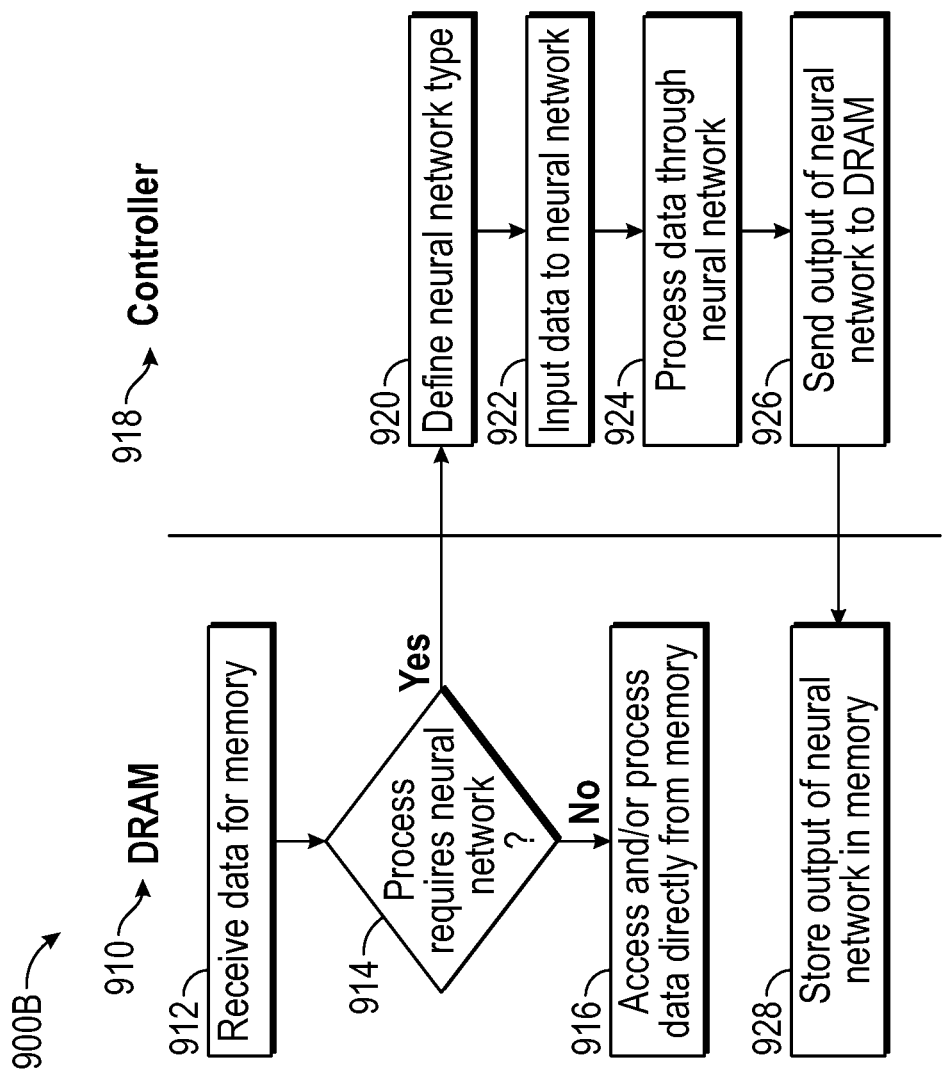
FIG. 9B illustrates an example of a process for performing one or more neural network operations according to some embodiments.

FIG. 9B illustrates an example 900B of a process for performing one or more neural network operations according to some embodiments. In step 912, the CPU can receive data from a host CPU to store into memory. The CPU can determine whether the request from the host CPU requires neural network computations at step 914. If not, then at step 916, the CPU can access and/or process the request directly from memory.

If the request requires a neural network operation, at step 920 the CPU can send characteristics of a neural network to a controller 918. The controller 918 can determine the corresponding neural network based on the received characteristics, and at step 922, input the data stored in memory into the neural network. The neural network engine can process the data through the neural network in step 924. In step 926, the controller 918 can send the output of the neural network to the DRAM, and at step 928, the DRAM 910 can store the output data into memory for the CPU to access.

In some embodiments, the memory device can process the data synchronously, and the CPU can wait for the neural network operations to complete. The CPU can optionally send an end function to stop the processing of data through the neural network during data processing. Otherwise, the CPU can poll the memory device. Advantageously for asynchronous processing, the CPU does not have to wait for neural network data processing.

CPU Delegation of Processing to the Non-Volatile Memory

Figure 10:
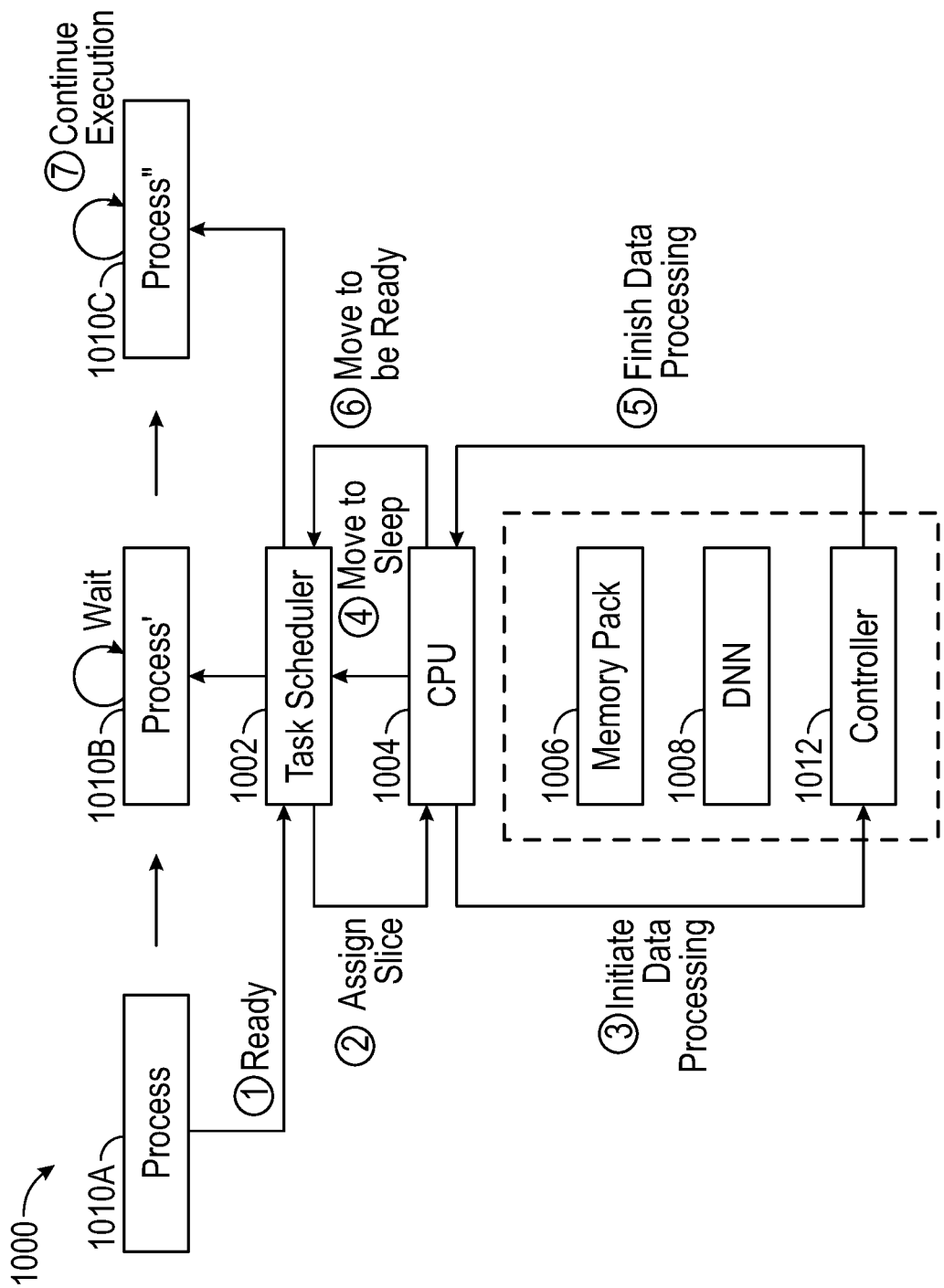
FIG. 10 illustrates an example of the CPU delegating data processing to the neural network according to some embodiments.

FIG. 10 illustrates an example of a process 1000 delegating data processing to the non-volatile memory implementing one or more neural networks according to some embodiments. The process 1000 can be implemented by a system including a controller as described herein, such as any of the systems 400, 500, or 900A. In step 1, the task scheduler 1002 (which can be implemented by a processor or controller) can select a process for execution, and the CPU can execute the selected process in the allocated time slice.

In step 2, the task scheduler 1002 can manage the delegation of tasks, such as by assigning a time slice to the CPU 1004 to perform a certain task, where the CPU activity is split between time slices. The CPU 1004 can initiate data processing in step 3 by sending the request to a controller 1012 of a smart memory device. The controller 1012 can configure a neural network 1008 to perform the neural network operation(s), receive the input data from memory 1006 (such as DRAM), process the data through the neural network, and send the output data to DRAM memory page, as described herein.

In some embodiments, while the data is being processed by the neural network, the CPU 1004 can indicate to the task scheduler 1002 to put the process into a sleep state (for example, because the CPU 1004 is waiting for completion of the neural network processing). Then, the task scheduler 1002 doesn't assign a time slice for the process' 1010B. In some embodiments, the CPU 1004 can perform other tasks while the controller 1012 is managing the neural network processing.

After neural network processing is finished in step 5, in step 6, the task scheduler 1002 is in a ready state. Advantageously, offloading the neural network processing from the CPU to the smart memory device can dramatically improve system performance by freeing the CPU's resources. In addition, the whole memory space can be able to perform large data processing without affecting the system performance. Also, power consumption can be reduced, for example, because processing-intensive neural network computations are performed by the non-volatile memory device, rather than the CPU.

Other Variations

Any of the embodiments disclosed herein can be used with any of the concepts disclosed in co-pending U.S. Patent Application No. 16/363,744, field on Mar. 25, 2019, and titled "ENHANCED STORAGE DEVICE MEMORY ARCHITECTURE FOR MACHINE LEARNING", which is hereby incorporated by reference in its entirety.

Those skilled in the art will appreciate that in some embodiments additional system components can be utilized, and disclosed system components can be combined or omitted. Although some embodiments describe video data transmission, disclosed systems and methods can be used for transmission of any type of data. In addition, although some embodiments utilize erasure coding, any suitable error correction schemes can be used. The actual steps taken in the disclosed processes may differ from those shown in the figures. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hard disk drives, hybrid hard drives, and the like. In addition, other forms of storage (such as, DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, references to "a method" or "an embodiment" throughout are not intended to mean the same method or same embodiment, unless the context clearly indicates otherwise.

The corresponding structures, materials, acts, and equivalents of all means or step plus function elements in the claims below are intended to include any structure, material, or act for performing the function in combination with other claimed elements as specifically claimed. The description of the various embodiments of the present disclosure has been presented for purposes of illustration and description, but is not intended to be exhaustive or limited to the embodiments disclosed. Many modifications and variations will be apparent to those of ordinary skill in the art without departing from the scope and spirit of this disclosure. The example embodiments were chosen and described in order to best explain the principles of this disclosure and the practical application, and to enable others of ordinary skill in the art to understand this disclosure for various embodiments with various modifications as are suited to the particular use contemplated.

Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A memory device configured to perform neural network computations, the device comprising:
   a volatile memory;
   a non-volatile memory configured to store one or more layers of a neural network; and
   a controller configured to:
      store data in at least one of the volatile memory or the non-volatile memory and retrieve data from at least one of the volatile memory or the non-volatile memory in response to at least one data transfer command received from a host system;
      perform neural network computations in the non-volatile memory by applying one or more neural network layers to input data received from the host system;
      store a result of the neural network computations in the volatile memory; and
      provide the result of the neural network computations to the host system asynchronously before completion of neural network computations for all neural network layers stored in the non-volatile memory.

2. The device of claim 1, wherein the input data is stored in the volatile memory.

3. The device of claim 1, wherein the controller is further configured to perform neural network computations for a plurality of neural networks and use a result of neural network computations for a first neural network as input data for a successive neural network.

4. The device of claim 3, wherein the controller is further configured to reconfigure the first neural network as the successive neural network before inputting the data into the successive network.

5. The device of claim 1, wherein the controller is a sole controller of the memory device.

6. The device of claim 1, wherein provision of the result asynchronously comprises at least one of polling a state of memory pages in the non-volatile memory or issuing an interrupt.

7. The device of claim 6, wherein the polling comprises periodic polling of the state of memory pages.

8. The device of claim 1, wherein the memory device is further configured to receive a request to initiate neural network computations, the request comprising neural network configuration parameters and input data for neural network computations.

9. The device of claim 8, wherein the request to initiate neural network computations comprises a type of data processing, and wherein the controller is further configured to identify neural network configuration parameters based on the type of data processing.

10. A method of performing neural network computations in a memory device, the method comprising:
    by a controller of the memory device:
       storing data in at least one of a volatile memory of the memory device or a non-volatile memory of the memory device and retrieving data from at least one of the volatile memory or the non-volatile memory in response to at least one data transfer command received from a host system;
       performing neural network computations in the non-volatile memory by applying one or more neural network layers of a neural network to input data received from the host system; and
       storing a result of the neural network computations in the volatile memory for retrieval by the host system, wherein the result of the neural network computations is configured to be retrieved synchronously following completion of neural network computations for all neural network layers stored in the non-volatile memory.

11. The method of claim 10, further comprising, by the controller, setting a locked state of the data before inputting the data into the neural network, and setting an unlocked state of the data after making the output of the neural network available, wherein the locked state prevents changing the data.

12. The method of claim 10, further comprising configuring the neural network based on at least one of a number of nodes or a type of activation function.

13. The method of claim 10, further comprising inputting the data into the neural network by initiating back propagation on the neural network, and wherein output of the neural network includes an adjusted weighting for one or more nodes of the neural network.

14. A data storage device comprising:
    a first memory;
    a second memory; and
    a controller configured to:
       store data in at least one of the first memory or the second memory and retrieve data from at least one of the first memory or the second memory in response to at least one data transfer command received from a host system;

perform neural network computations for a plurality of neural networks in the second memory by applying neural network layers to input data received from the host system and stored in the first memory, wherein a first result of neural network computations for a first neural network is used as input data for a successive neural network; and store a result of the neural network computations in the first memory for retrieval by the host system.

15. The device of claim 14, wherein the device is configured to receive a request to initiate neural network computations comprising a type of data processing, and wherein the controller is further configured to identify neural network configuration parameters based on the type of data processing.

16. The device of claim 14, wherein the plurality of neural networks is not directly accessible by a processor of the host system.

17. The device of claim 14, wherein the device is configured to receive neural network configuration parameters and input data for the neural network computations, and wherein the controller is further configured to define one or more neural network layers based on the neural network configuration parameters.

18. The device of claim 14, wherein the device is configured to receive a request to perform a data processing function comprising a type of data processing, and wherein the controller is further configured to identify neural network configuration parameters based on the type of data processing and define one or more neural network layers based on the neural network configuration parameters.

* * * * *